United States Patent
Nakagawa (10) Patent No.: US 9,843,305 B2
(45) Date of Patent: Dec. 12, 2017

(54) ELASTIC WAVE RESONATOR, ELASTIC WAVE FILTER DEVICE, AND DUPLEXER

(71) Applicant: Murata Manufacturing Co., Ltd., Nagaokakyo-shi, Kyoto-fu (JP)

(72) Inventor: Ryo Nakagawa, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 78 days.

(21) Appl. No.: 15/014,174

(22) Filed: Feb. 3, 2016

(65) Prior Publication Data

US 2016/0149554 A1 May 26, 2016

Related U.S. Application Data

(63) Continuation of application No. PCT/JP2014/072948, filed on Sep. 1, 2014.

(30) Foreign Application Priority Data

Sep. 6, 2013 (JP) .................................. 2013-185421

(51) Int. Cl.
*H03H 9/72* (2006.01)
*H03H 9/64* (2006.01)
(Continued)

(52) U.S. Cl.
CPC ........ *H03H 9/725* (2013.01); *H03H 9/02755* (2013.01); *H03H 9/02763* (2013.01);
(Continued)

(58) Field of Classification Search
CPC ........... H03H 9/02637; H03H 9/02685; H03H 9/0274; H03H 9/02763; H03H 9/02755;
(Continued)

(56) References Cited

U.S. PATENT DOCUMENTS 6,441,704 B1 * 8/2002 Ali-Hackl ............ H03H 9/0038
310/313 B
6,940,368 B2 * 9/2005 Plessky ................ H03H 9/0028
333/193

(Continued)

FOREIGN PATENT DOCUMENTS

JP 2003-332884 A * 11/2003
JP 2004-320411 A 11/2004

(Continued)

OTHER PUBLICATIONS

Official Communication issued in International Patent Application No. PCT/JP2014/072948, dated Oct. 28, 2014.

(Continued)

*Primary Examiner* — Barbara Summons
(74) *Attorney, Agent, or Firm* — Keating & Bennett, LLP (57) ABSTRACT

An elastic wave includes a piezoelectric substrate having a polarization direction denoted by an arrow Px, and first and second IDT electrodes arranged on the substrate in an elastic wave propagation direction with a shared reflector therebetween. A first bus bar of the first IDT electrode and a first end portion bus bar of a second reflector are connected to a wiring electrode to define a first terminal. A second bus bar of the first IDT electrode and a second end portion bus bar of the shared reflector are connected to each other to define a second terminal. A first end portion bus bar and a first bus bar are electrically connected to each other. A second bus bar and a second end portion bus bar are electrically connected to each other, and the first and second IDT electrodes and are connected in parallel between the first and second terminals.

18 Claims, 7 Drawing Sheets

(51) Int. Cl.
  *H03H 9/25* (2006.01)
  *H03H 9/02* (2006.01)
  *H03H 9/13* (2006.01)
  H03H 9/17 (2006.01)
  H03H 9/54 (2006.01)
  H03H 9/60 (2006.01)

(52) U.S. Cl.
  CPC ........ *H03H 9/02992* (2013.01); *H03H 9/132* (2013.01); *H03H 9/25* (2013.01); *H03H 9/64* (2013.01); *H03H 9/6469* (2013.01); *H03H 9/6483* (2013.01); *H03H 9/17* (2013.01); *H03H 9/54* (2013.01); *H03H 9/605* (2013.01)

(58) Field of Classification Search
  CPC ...... H03H 9/02992; H03H 9/132; H03H 9/17; H03H 9/25; H03H 9/54; H03H 9/605; H03H 9/64; H03H 9/6433; H03H 9/6436; H03H 9/6469; H03H 9/6483; H03H 9/725
  USPC .......... 333/133, 193–196; 310/313 B, 313 D
  See application file for complete search history.

(56) References Cited

U.S. PATENT DOCUMENTS

| 7,535,323 | B2* | 5/2009 | Barber | ................... | H03H 9/605 |
|---|---|---|---|---|---|
| | | | | | 310/357 |
| 8,018,298 | B2* | 9/2011 | Ueda | ...................... | H03H 9/562 |
| | | | | | 333/133 |
| 2008/0018417 | A1 | 1/2008 | Igaki et al. | | |
| 2008/0055020 | A1* | 3/2008 | Handtmann | ......... | H03H 9/0095 |
| | | | | | 333/189 |
| 2008/0252398 | A1* | 10/2008 | Jamneala | ............... | H03H 9/581 |
| | | | | | 333/189 |
| 2008/0297278 | A1* | 12/2008 | Handtmann | ......... | H03H 9/0095 |
| | | | | | 333/189 |
| 2009/0231060 | A1* | 9/2009 | Rusakov | .............. | H03H 9/6483 |
| | | | | | 333/195 |
| 2016/0049920 | A1* | 2/2016 | Kishino | ............... | H03H 9/0033 |
| | | | | | 343/858 |
| 2016/0118956 | A1* | 4/2016 | Kihara | .................... | H03H 9/25 |
| | | | | | 333/133 |

FOREIGN PATENT DOCUMENTS

JP    2006-303932 A    11/2006
WO   2005/107069 A1   11/2005

OTHER PUBLICATIONS

Inoue, S. et al., "A Triple-Beat-Free PCS SAW Duplexer", IEEE Ultrason. Symp., 4 pages, 2012.

* cited by examiner

COMPARATIVE EXAMPLE

ELASTIC WAVE RESONATOR, ELASTIC WAVE FILTER DEVICE, AND DUPLEXER

BACKGROUND OF THE INVENTION

1. Field of the Invention

The present invention relates to a one-port elastic wave resonator in which interdigital transducer (IDT) electrodes are provided on a piezoelectric substrate. The present invention also relates to an elastic wave filter device and a duplexer including the above-described one-port elastic wave resonator.

2. Description of the Related Art

Up to now, surface acoustic wave resonators have been widely used for resonators which form a filter device. In the one-port surface acoustic wave resonator described in "A Triple-Beat-Free PCS SAW Duplexer", (IEEE Ultrason. Symp., pp. 67-70, 2012), an IDT electrode is divided into sections connected in series. Here, a first IDT electrode and a second IDT electrode are connected in series with each other. The areas of the first and second IDT electrodes have been increased so as to realize an impedance that is the same as that in the case of no division. As a result, the energy density within the first and second IDT electrodes is lowered, and distortion due to nonlinear signals is reduced.

On the other hand, Japanese Unexamined Patent Application Publication No. 2004-320411 discloses a surface acoustic wave device for increasing thermal shock resistance. In this surface acoustic wave resonator device, two surface acoustic wave resonator portions are formed on a piezoelectric substrate. The two surface acoustic wave resonator portions are electrically connected in parallel with each other. In other words, the first and second IDT electrodes forming the first and second surface acoustic wave resonator portions are electrically connected in parallel with each other.

The surface acoustic wave device described in "A Triple-Beat-Free PCS SAW Duplexer", (IEEE Ultrason. Symp., pp. 67-70, 2012) allows nonlinear distortion to be reduced. However, the first and second IDT electrodes have increased areas. Hence, a reduction in size was difficult.

On the other hand, the surface acoustic wave device disclosed in Japanese Unexamined Patent Application Publication No. 2004-320411 employs a parallel connection structure to increase thermal shock resistance. With this structure, nonlinear distortion can be suppressed without increasing the areas of the IDT electrodes. However, with the parallel connection structure disclosed in Japanese Unexamined Patent Application Publication No. 2004-320411, wiring lines for connecting the first and second IDT electrodes occupy a large space. Hence, a reduction in size is difficult also with this structure.

SUMMARY OF THE INVENTION

Preferred embodiments of the present invention provide a one-port elastic wave resonator that significantly reduces or prevents nonlinear distortion and realizes a reduction in size.

Preferred embodiments of the present invention also provide an elastic wave filter device and a duplexer including elastic wave resonators that significantly reduce or prevent nonlinear distortion and realize a reduction in size.

An elastic wave resonator according to a preferred embodiment of the present invention is a one-port elastic wave resonator including a first terminal and a second terminal. The elastic wave resonator according to the present preferred embodiment of the present invention includes a piezoelectric substrate having a polarization direction, first and second IDT electrodes, a shared reflector, and first and second reflectors.

The first and second IDT electrodes extend in an elastic wave propagation direction on the piezoelectric substrate. The shared reflector is located between the first IDT electrode and the second IDT electrode. The first reflector is located opposite to the shared reflector with the first IDT electrode therebetween. The second reflector is located opposite to the shared reflector with the second IDT electrode therebetween.

In an elastic wave resonator according to a preferred embodiment of the present invention, a direction obtained by projecting the polarization direction onto a substrate surface of the piezoelectric substrate is defined to be a projected polarization direction. The projected polarization direction is perpendicular or substantially perpendicular to the elastic wave propagation direction on the piezoelectric substrate. Further, it is assumed that a leading end side in the projected polarization direction is a first end portion side, and a base end side in the projected polarization direction is a second end portion side.

In a preferred embodiment of the present invention, an elastic wave resonator further includes a wiring electrode electrically connecting respective first end portion side portions of the first reflector, the first IDT electrode, and the second reflector to one another. The wiring electrode defines the first terminal.

Respective second end portion side portions of the first IDT electrode and the shared reflector are electrically connected to each other and define the second terminal. Respective first end portion side portions of the shared reflector and the second IDT electrode are electrically connected to each other. Respective second end portion side portions of the second IDT electrode and the second reflector are electrically connected to each other.

The first and second IDT electrodes are connected in parallel between the first terminal and the second terminal.

In a specific aspect of an elastic wave resonator according to a preferred embodiment of the present invention, a voltage application direction in the first IDT electrode and a voltage application direction in the second IDT electrode are opposite to each other in the projected polarization direction.

In another specific aspect of an elastic wave resonator according to a preferred embodiment of the present invention, the first end portion side portion of the first reflector is electrically connected to the first end portion side portion of the first IDT electrode.

In still another specific aspect of an elastic wave resonator according to a preferred embodiment of the present invention, each of the first reflector, the shared reflector, and the second reflector includes a first end portion bus bar located on the first end portion side and a second end portion bus bar located on the second end portion side. Each of the first and second IDT electrodes includes a first bus bar located on the first end portion side and a second bus bar located on the second end portion side. The second bus bar of the first IDT electrode and the second end portion bus bar of the shared reflector are concatenated and unified. The first end portion bus bar of the shared reflector and the first bus bar of the second IDT electrode are concatenated and unified. The second bus bar of the second IDT electrode and the second end portion bus bar of the second reflector are concatenated and unified.

In another specific aspect of an elastic wave resonator according to a preferred embodiment of the present invention, a structure is provided in which in each of portions where the bus bars and the corresponding end portion bus bars are respectively concatenated and unified, the concatenated end portion bus bar and the corresponding bus bar extend in the same direction and have the same width.

An elastic wave filter device according to a preferred embodiment of the present invention includes a plurality of elastic wave resonators, and at least one of the plurality of elastic wave resonators is defined by the elastic wave resonator configured in accordance with a preferred embodiment of the present invention.

In a specific aspect of an elastic wave filter device according to a preferred embodiment of the present invention, the plurality of elastic wave resonators define at least a portion of a ladder circuit.

In another specific aspect of an elastic wave filter device according to a preferred embodiment of the present invention, the ladder circuit includes a plurality of series arm resonators and a plurality of parallel arm resonators. The plurality of series arm resonators and the plurality of parallel arm resonators are defined by the plurality of elastic wave resonators. At least one resonator among the series arm resonators and the parallel arm resonators is defined by the elastic wave resonator configured in accordance with a preferred embodiment of the present invention.

A duplexer according to another preferred embodiment of the present invention includes a first band pass filter connected to an antenna end and a second band pass filter that is connected to the antenna end and that has a pass band different from that of the first band pass filter. At least one of the first and second band pass filters includes the elastic wave resonator according to a preferred embodiment of the present invention.

In a specific aspect of a duplexer according to a preferred embodiment of the present invention, at least one of the first and second band pass filters includes a plurality of elastic wave resonators, and at least one elastic wave resonator among the plurality of elastic wave resonators closest to the antenna end is defined by an elastic wave resonator configured in accordance with a preferred embodiment of the present invention.

According to an elastic wave resonator of a preferred embodiment of the present invention, in a structure in which the first and second IDT electrodes are connected in parallel between the first and second terminals, the electrode structure including the IDT electrodes and reflectors has a structure as described above and, hence, nonlinear distortion is significantly reduced or prevented and, further, a reduction in size is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

Figure 1A:
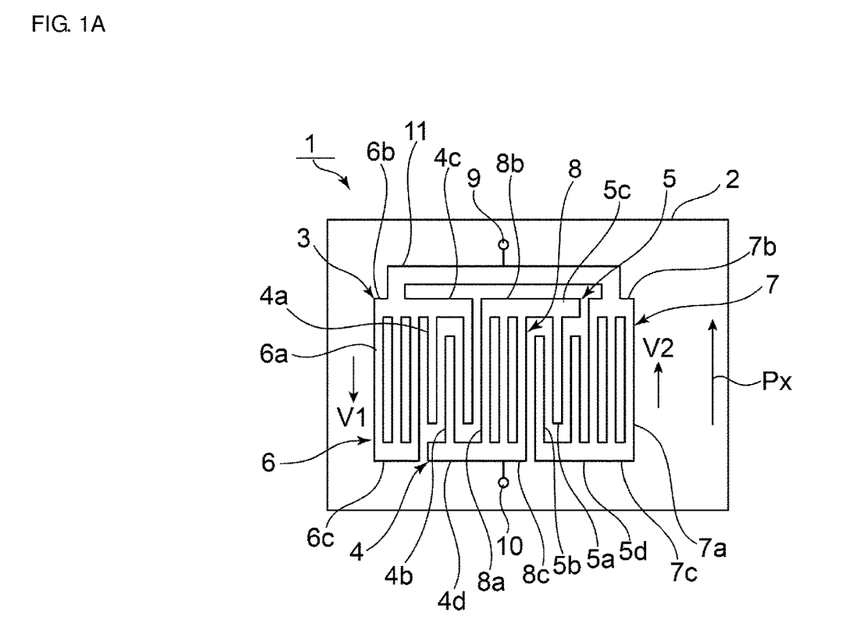
FIG. 1A and FIG. 1B are respectively a plan view and a side view of an elastic wave resonator according to a first preferred embodiment of the present invention.
Figure 1B:
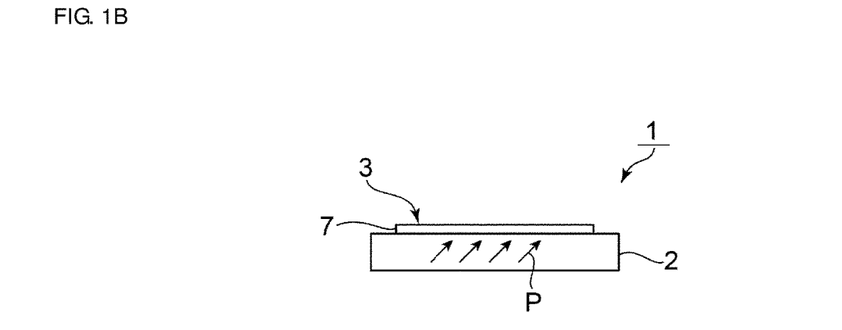

FIG. 1A and FIG. 1B are respectively a plan view and a side view of an elastic wave resonator according to a first preferred embodiment of the present invention. An elastic wave resonator 1 includes a piezoelectric substrate 2. In the present preferred embodiment, the piezoelectric substrate 2 is preferably made of a $LiTaO_3$ substrate. However, the piezoelectric substrate 2 may be formed of another piezoelectric monocrystal such as $LiNbO_3$, or another piezoelectric ceramic. In the piezoelectric substrate 2, the polarization direction is a direction P. A direction corresponding to the direction P projected on the piezoelectric substrate surface is defined as a projected polarization direction Px.

An electrode structure 3 is provided on the piezoelectric substrate 2. A one-port elastic wave resonator is defined by the electrode structure 3. In other words, a one-port surface acoustic wave resonator including a first terminal 9 and a second terminal 10 is provided.

The electrode structure 3 preferably is a multilayer metal structure including Ti and AlCu alloy in the present preferred embodiment. However, the metal materials defining the electrode structure 3 are not specifically limited, and may be include Ag, Pd, W, Mo, Ti, Al, Cu, Au, Pt, or an appropriate alloy mainly including these metals. The electrode structure 3 may include a multilayer metal film. The electrode structure 3 described above includes first and second IDT electrodes 4 and 5, first and second reflectors 6 and 7, a shared reflector 8, and a wiring electrode 11.

The first IDT electrode 4 and the second IDT electrode are arranged in the elastic wave propagation direction with the shared reflector 8 interposed therebetween. Note that the elastic wave propagation direction is a direction perpendicular or substantially perpendicular to the projected polarization direction Px described above.

It is defined that the leading end side in the projected polarization direction Px is a first end portion side, and the base end side is a second end portion side. Hence, in FIG. 1A, the first terminal 9 side is the first end portion side and the second terminal 10 side is the second end portion side.

The first IDT electrode 4 includes first electrode fingers 4a and a second electrode finger 4b. The first electrode fingers 4a and the second electrode finger 4b are interdigitated.

The first electrode fingers 4a and the second electrode finger 4b extend along the projected polarization direction Px described above. The base ends of the first electrode fingers 4a are connected to a first bus bar 4c. The base end of the second electrode finger 4b is connected to a second bus bar 4d.

The second IDT electrode 5, which preferably also has a similar configuration, includes first and second electrode fingers 5a and 5b and first and second bus bars 5c and 5d.

In the first and second IDT electrodes 4 and 5 described above, the first bus bars 4c and 5c are located on the first end portion side described above, and the second bus bars 4d and 5d are located on the second end portion side described above.

The first reflector 6 includes a plurality of electrode fingers 6a. First end portion side ends of the plurality of electrode fingers 6a are connected to one another by a first end portion bus bar 6b. Second end portion side ends of the plurality of electrode fingers 6a are connected to one another by a second end portion bus bar 6c. Similarly, the shared reflector 8 includes a plurality of electrode fingers 8a and first and second end portion bus bars 8b and 8c. Similarly, the second reflector 7 also includes a plurality of electrode fingers 7a and first and second end portion bus bars 7b and 7c.

In the first and second reflectors 6 and 7 and the shared reflector 8, the first end portion bus bars 6b, 7b and 8b are located on the first end portion side and the second end portion bus bars 6c, 7c, and 8c are located on the second end portion side.

In the elastic wave resonator 1, the first end portion bus bar 6b and the first bus bar 4c are electrically connected to each other. In the present preferred embodiment, the first end portion bus bar 6b and the first bus bar 4c preferably have the same width, extend in the same direction, and are concatenated and unified. Hence, the first end portion bus bar 6b and the first bus bar 4c have a structure that is able to be easily formed by a printing method, a deposition method, and the like.

The first end portion bus bar 6b and the first bus bar 4c are electrically connected to the first end portion bus bar 7b by the wiring electrode 11. The wiring electrode 11 is connected to the first terminal 9. In FIG. 1A, the first terminal 9 is provided separately from the wiring electrode 11; however the wiring electrode 11 itself may be made to be the first terminal 9.

Note that in the present preferred embodiment, the first end portion bus bar 6b preferably is electrically connected to the first bus bar 4c, and further electrically connected to the wiring electrode 11. However, in the present invention, the first end portion bus bar 6b need not be electrically connected to the first bus bar 4c. In this case, only the first bus bar 4c needs to be electrically connected to the wiring electrode 11. In other words, it is only required that the first end portion side end of the first IDT electrode 4 and the first end portion side end of the second reflector 7 are electrically connected to each other and are electrically connected to the first terminal 9.

However, the symmetry of the whole electrode structure is significantly improved by concatenating and unifying the first end portion bus bar 6b of the first reflector 6 and the first bus bar 4c.

The wiring electrode 11 extends along the elastic wave propagation direction on the first end portion side where the first and second IDT electrodes 4 and 5, the first and second reflectors 6 and 7, and the shared reflector 8 are arranged in the elastic wave propagation direction. Hence, the wiring electrode 11 has a structure that is able to be formed without considerably increasing the size of the whole structure of the electrode structure 3.

The second bus bar 4d and the second end portion bus bar 8c are concatenated and unified. The first end portion bus bar 8b and the first bus bar 5c are concatenated and unified. The second bus bar 5d and the second end portion bus bar 7c are concatenated and unified.

In the present preferred embodiment, in each portion where an end portion bus bar and a bus bar are concatenated and unified, the two bus bars preferably have the same width and extend in the same direction and are concatenated, similarly to the portion where the first end portion bus bar 6b and the first bus bar 4c described above are concatenated and unified.

However, it is not required that each end portion bus bar and a corresponding bus bar be connected to each other such that the two bus bars have the same width and extend in the same direction, as long as the two bus bars are electrically connected to each other.

In the present preferred embodiment, the electrode structure 3 preferably has a structure as described above. In this case, the portion in which the second bus bar 4d and the second end portion bus bar 8c are concatenated and unified defines the second terminal 10. Hence, the first and second IDT electrodes 4 and 5 are electrically connected in parallel with each other between the first terminal 9 and the second terminal 10.

A voltage application direction in the first IDT electrode 4 is made to be opposite to a voltage application direction in the second IDT electrode 5 in the projected polarization direction Px described above. Here, in the case where the first terminal 9 is the hot side, the voltage application direction in the first IDT electrode 4 is the direction from the first bus bar 4c, which is a hot-side bus bar, to the second bus bar 4d, which is a ground-side bus bar, as illustrated by an arrow V1 in FIG. 1A. As illustrated in FIG. 1A, the voltage application direction V1 in the first IDT electrode 4 is made to be opposite to a voltage application direction V2 in the second IDT electrode 5.

The elastic wave resonator 1, which has a structure as described above, effectively reduces or prevents nonlinear distortion. This will be described on the basis of a specific non-limiting experimental example.

A non-limiting experimental example of the elastic wave resonator 1 described above with the following specifications was produced.

Each of the IDT electrodes 4 and 5 has a multilayer structure of Ti/AlCu layers, with a thickness of 30 nm/380 nm. The number of electrode fingers is 40 pairs. An electrode finger overlap width is 100 μm. A dimension in the width direction of the first and second bus bars 4c, 4d, 5c, and 5d is 15 μm. The number of electrode fingers 6a, 7a, and 8a in the first and second reflectors 6 and 7 and the shared reflector 8 is 15 each. A dimension in the width direction of the first and second end portion bus bars 6b, 6c, 7b, 7c, 8b, and 8c is 15 μm.

For comparison, the following first and second comparative examples were prepared. As the first comparative example, a usual one-port elastic wave resonator was prepared in which reflectors are arranged on both sides of a single IDT electrode without parallel division. This is the same as the preferred embodiment of the present invention described above except that the electrode finger overlap width of the IDT electrodes is 100 μm, the number of pairs of electrode fingers is 80 pairs, the IDT electrode is not divided into sections connected in parallel, and the reflectors on both sides are not electrically connected to the IDT electrode.

Figure 8:
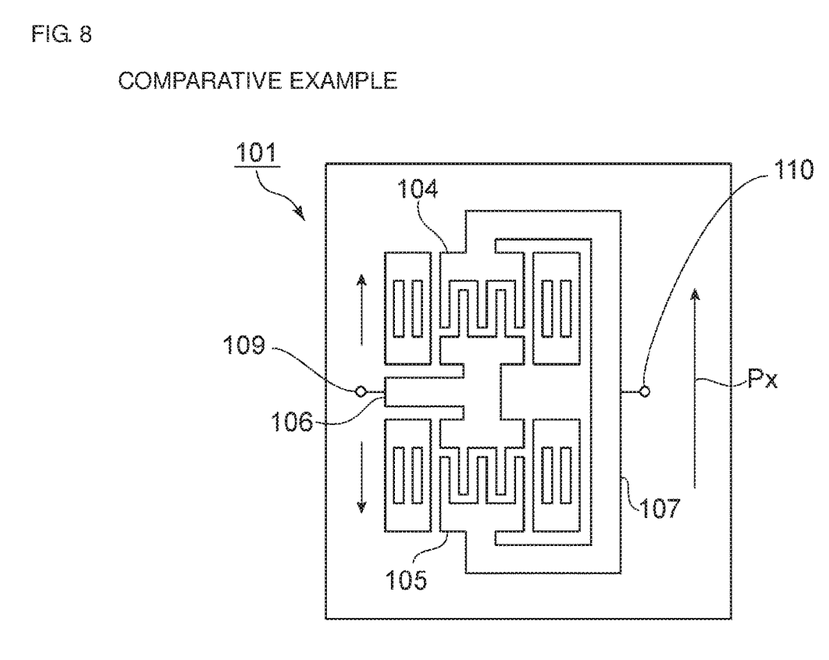
FIG. 8 is a plan view of an elastic wave resonator of a second comparative example.

As the second comparative example, an elastic wave resonator 101 having an electrode structure illustrated in FIG. 8 was produced. In the elastic wave resonator 101 illustrated in FIG. 8, similarly to the elastic wave resonator 1, IDT electrodes 104 and 105 are connected in parallel with each other between first and second terminals 109 and 110. However, respective first bus bars of the first IDT electrode 104 and the second IDT electrode 105 are connected to each other by a wiring line 106 and are connected to the first terminal 109. Further, respective second bus bars of the first and second IDT electrodes 104 and 105 are connected to each other by a wiring line 107. The wiring line 107 is connected to the second terminal 110. The wiring line 107 surrounds a portion where the main portions of the first and second IDT electrodes 104 and 105 are provided. Hence, a large space is required. The rest of the configuration is similar to that of the preferred embodiment of the present invention described above.

Figure 6:
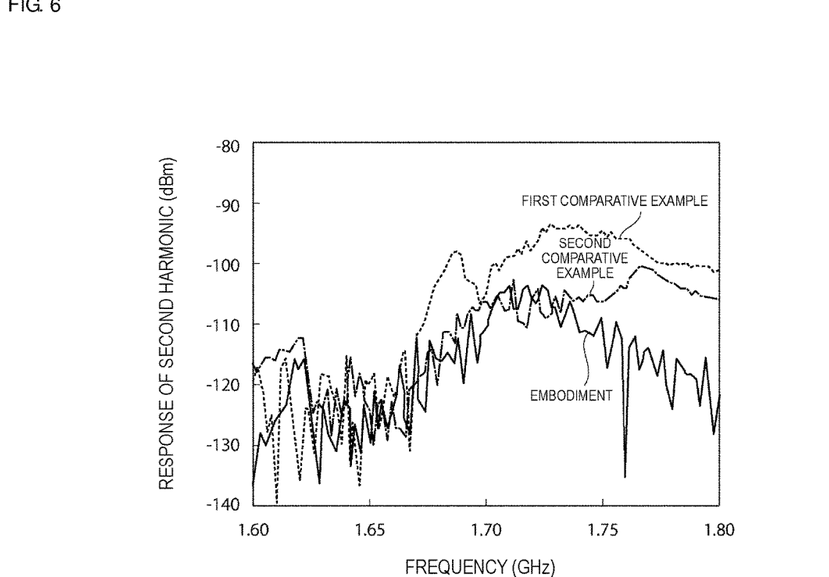
FIG. 6 is a diagram illustrating attenuation frequency characteristics showing the second harmonic responses of an elastic wave resonator according to a preferred embodiment of the present invention and elastic wave resonators of first and second comparative examples.

FIG. 6 is a diagram illustrating the attenuation frequency characteristics of the second harmonic in the preferred embodiment of the present invention described above and the first and second comparative examples, where the solid line represents the result for the preferred embodiment of the present invention described above, the broken line represents the result for the first comparative example, and the one-dot chain line represents the result for the second comparative example.

As is clear from FIG. 6, according to the second comparative example, the second harmonic response can be reduced compared with the first comparative example. Further, it can be seen that according to the preferred embodiment of the present invention described above, the second harmonic response is further effectively reduced even compared with the second comparative example. In other words, it can be seen that the second-order nonlinear distortion is effectively reduced. The reason why the nonlinear distortion was improved compared with the second comparative example is thought to be that waves are coupled to each other between the two IDTs through the shared reflector, such that the symmetry of the amplitude in the structure was improved.

In addition, in the present preferred embodiment, since the electrode structure 3 has a structure as described above, a considerable reduction in size is realized. In other words, the resonant portion including the first IDT electrode 4 and the resonant portion including the second IDT electrode 5 share the shared reflector 8. Hence, compared with the second comparative example illustrated in FIG. 8, the number of reflectors is decreased by one. Further, since the wiring electrode 11 need only electrically connect the first bus bar 4c and the first end portion bus bar 7b to each other on the first end portion side of the electrode structure 3, the space required for the wiring of the wiring electrode 11 is also considerably reduced. Hence, a considerable reduction in size is realized in the elastic wave resonator 1.

Note that in the preferred embodiment described above, the first end portion bus bar 6b and the first bus bar 4c of the first IDT electrode 4 preferably are concatenated. However, they may be electrically separated from each other. In this case, the wiring electrode 11 needs to be electrically connected to only the first bus bar 4c.

Next, duplexers according to second to fifth preferred embodiments of the present invention will be described.

Figure 2:
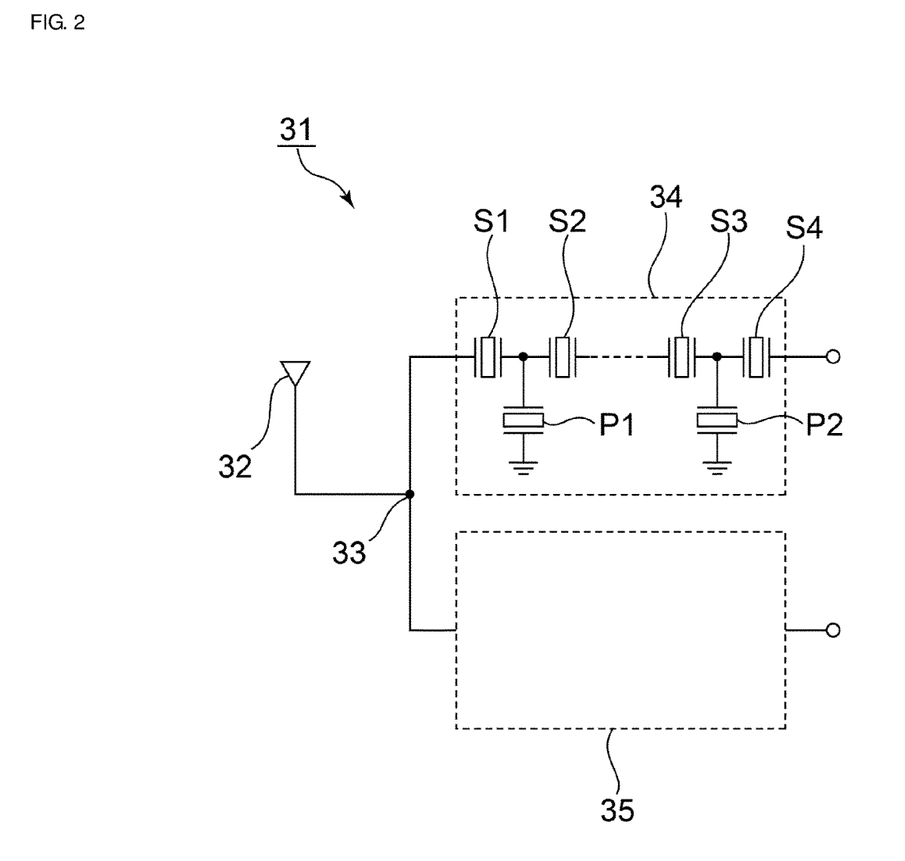
FIG. 2 is a circuit diagram illustrating a duplexer according to a second preferred embodiment of the present invention.

FIG. 2 is a circuit diagram of a duplexer according to a second preferred embodiment of the present invention. In a duplexer 31, an antenna terminal 33 is connected to an antenna 32. Respective first ends of a first band pass filter 34 and a second band pass filter 35 are connected to the antenna terminal 33. In the present preferred embodiment, the first band pass filter 34 defines a transmission filter of a cellular phone and the second band pass filter 35 defines a reception filter. In other words, the pass band of the second band pass filter 35 is different from the pass band of the first band pass filter 34.

In the second preferred embodiment, the first band pass filter 34 includes a plurality of series arm resonators S1 to S4 and a plurality of parallel arm resonators P1 and P2. In other words, a ladder circuit is defined.

The plurality of series arm resonators S1 to S4 and the plurality of parallel arm resonators P1 and P2 respectively include elastic wave resonators. In the present preferred embodiment, among these elastic wave resonators, the series arm resonator S1 and the parallel arm resonator P1 closest to the antenna terminal 33 include the respective elastic wave resonators 1 of the preferred embodiment described above. Hence, nonlinear distortion is effectively reduced or prevented, and a reduction in the size of the first band pass filter 34 including elastic wave filter devices, and also, a reduction in the size of the duplexer 31 are realized.

Note that in the duplexer 31, in the first band pass filter 34, although the series arm resonator S1 and the parallel arm resonator P1 preferably include the respective elastic wave resonators 1 described above, only the series arm resonator S1 may include the elastic wave resonator 1. Further, all of the plurality of series arm resonators S1 to S4 and parallel arm resonators P1 and P2 may include the respective elastic wave resonators 1. In other words, it is only required that at least one of the plurality of elastic wave resonators include an elastic wave resonator according to a preferred embodiment of the present invention.

However, in the first band pass filter 34 of the duplexer 31, it is preferable that nonlinear distortion be significantly reduced or prevented in the elastic wave resonator closest to the composite end. Hence, as in the preferred embodiment described above, the elastic wave resonators 1 of the preferred embodiment described above are preferably used as the series arm resonator S1 and the parallel arm resonator P1. In this case, the elastic wave resonator 1 described above may be used only as the series arm resonator S1 closest to the antenna terminal 33.

Figure 3:
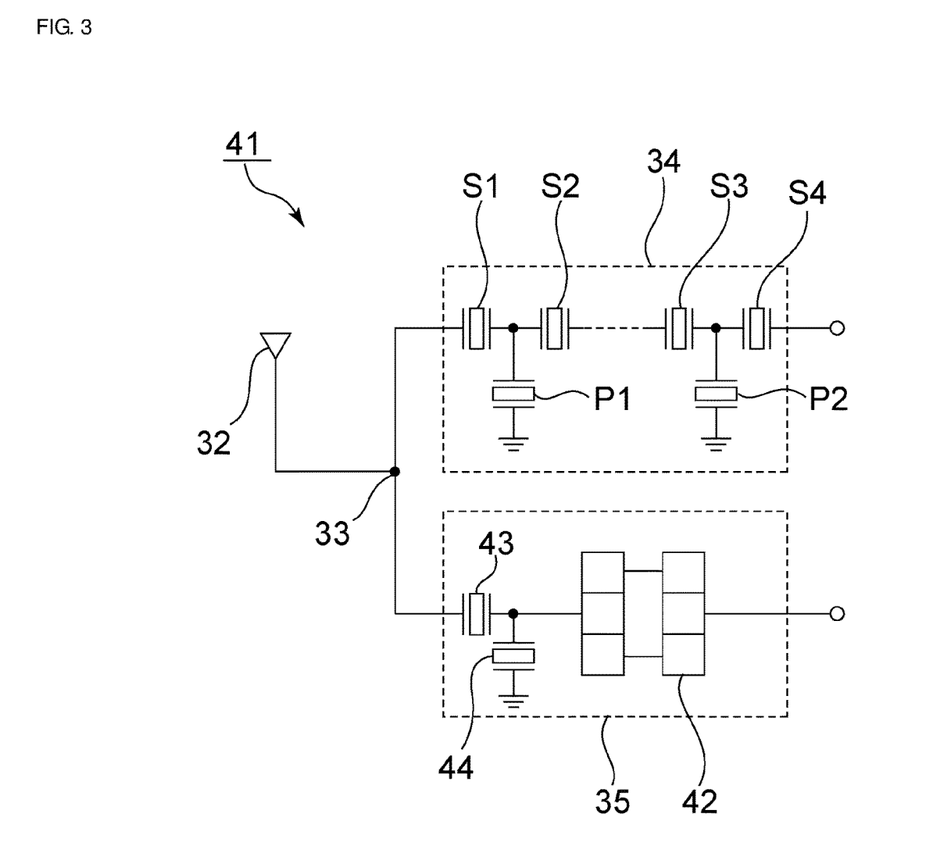
FIG. 3 is a circuit diagram illustrating a duplexer according to a third preferred embodiment of the present invention.

In a duplexer 41 according to a third preferred embodiment illustrated in FIG. 3, a first band pass filter 34 has a structure similar to the duplexer 31 of the second preferred embodiment. Here, a second band pass filter 35 includes a longitudinally coupled resonator-type elastic wave filter 42 and elastic wave resonators 43 and 44. The elastic wave resonator 43 is connected between the longitudinally coupled resonator-type elastic wave filter 42 and the antenna terminal 33, and the elastic wave resonator 44 is connected between a connection node between the elastic wave resonator 43 and the longitudinally coupled resonator-type elastic wave filter 42 and a ground potential.

Also in the second band pass filter 35 including the longitudinally coupled resonator-type elastic wave filter 42 described above, it is preferable that at least one of the elastic wave resonators 43 and 44 include the elastic wave resonator 1 described above. This will allow nonlinear distortion in the second band pass filter 35 to be significantly reduced or prevented. Also in this case, only the elastic wave resonator 43 may include the elastic wave resonator 1. Further, only the elastic wave resonator 44 may include the elastic wave resonator 1.

Figure 4:
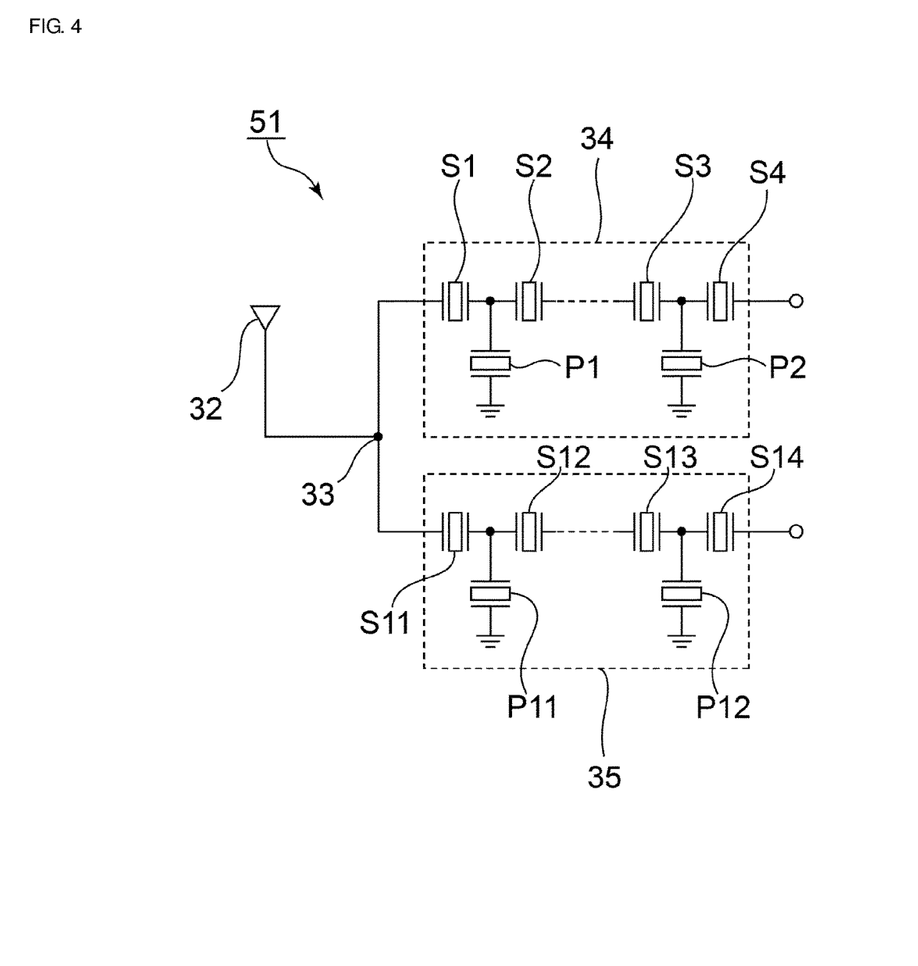
FIG. 4 is a circuit diagram illustrating a duplexer according to a fourth preferred embodiment of the present invention.

In a duplexer 51 according to a fourth preferred embodiment of the present invention illustrated in FIG. 4, a first band pass filter 34 has a structure similar to the duplexer 41 of the third preferred embodiment. A second band pass filter 35 is a ladder filter including a plurality of series arm resonators S11 to S14 and a plurality of parallel arm resonators P11 and P12. In this manner, the second band pass filter 35 may also be include a ladder filter. In this case, the plurality of series arm resonators S11 to S14 and the plurality of parallel arm resonators P11 and P12 are respectively elastic wave resonators. It is preferable that at least one elastic wave resonator of the plurality of elastic wave resonators be the elastic wave resonator 1 according to a preferred embodiment of the present invention described above.

More preferably, at least one of the series arm resonator S11 and the parallel arm resonator P11 closest to the antenna terminal 33, i.e., a composite end includes an elastic wave resonator according to a preferred embodiment of the present invention. With this configuration, second-order nonlinear distortion on the second band pass filter 35 side is effectively reduced or prevented.

Figure 5:
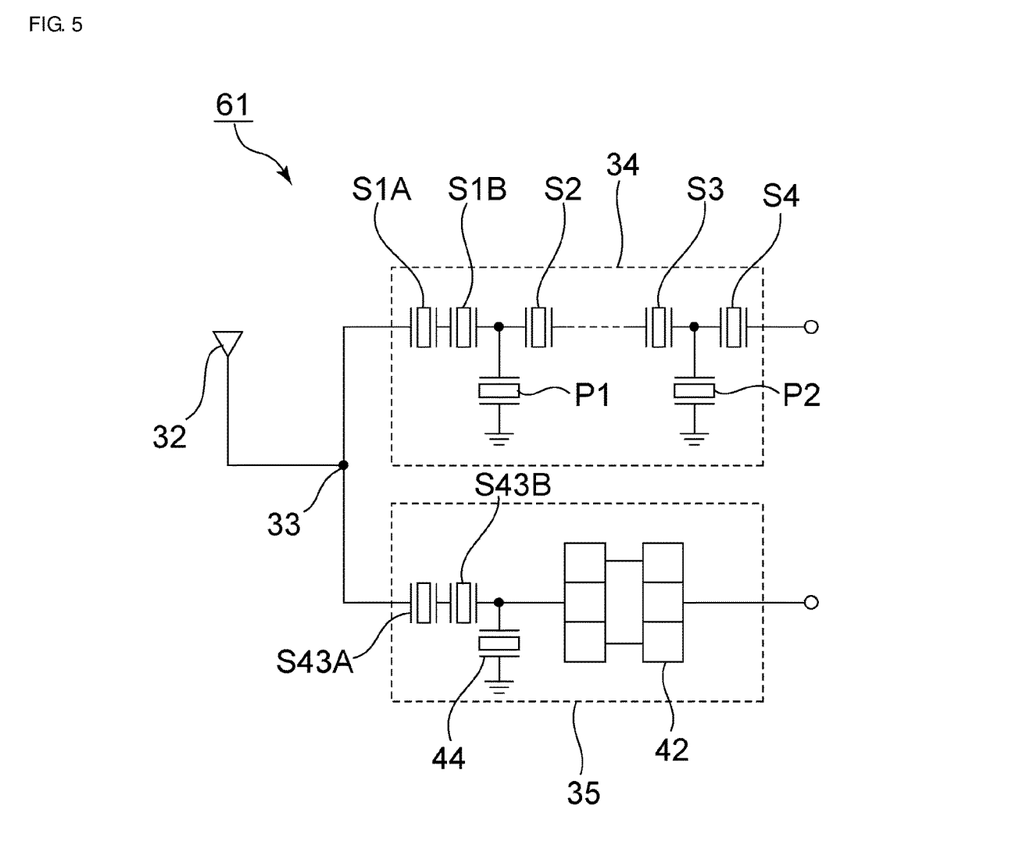
FIG. 5 is a circuit diagram illustrating a duplexer according to a fifth preferred embodiment of the present invention.

FIG. 5 is a circuit diagram of a duplexer 61 according to a fifth preferred embodiment of the present invention. In the duplexer 61, a first band pass filter 34 includes, on the antenna terminal 33 side, a structure in which a series arm resonators S1A and S1B are connected in series with each other. A second band pass filter 35 also includes, on the antenna terminal 33 side, a structure in which a plurality of elastic wave resonators S43A and S43B are connected in series with each other.

Except for the points described above, the first band pass filter 34 is similar to the first band pass filter 34 of the duplexer 31 of the second preferred embodiment. Further, the second band pass filter 35 is similar to the second band pass filter 35 of the duplexer 41 of the third preferred embodiment, except for the points described above. In this manner, each of the series arm resonators closest to the composite end may be divided into two series arm resonators. Also in this case, for example, by providing the parallel arm resonator P1 and the elastic wave resonator 44 to include the elastic wave resonators 1 according to a preferred embodiment of the present invention described above, second-order nonlinear distortion is effectively reduced or prevented, and a reduction in size is realized.

In the second to fifth preferred embodiments described above, duplexers each including the first and second band pass filters 34 and 35 were described. In this way, various preferred embodiments of the present invention also may be applied to band pass filter devices such as the first band pass filter 34 and the second band pass filter 35.

Hence, as in the first band pass filter 34 of the third preferred embodiment, for example, a filter device with a ladder circuit configuration including a plurality of elastic wave resonators also corresponds to a filter device according to a preferred embodiment of the present invention. Similarly, not limited to a device including a ladder circuit configuration, various preferred embodiments of the present invention may be generally applied to an elastic wave filter device including a plurality of elastic wave resonators. Further, as in the second band pass filter 35 of the third preferred embodiment including also the longitudinally coupled resonator-type elastic wave filter 42, various preferred embodiments of the present invention may be applied to a filter device including an elastic wave resonator and other filter elements.

Figure 7:
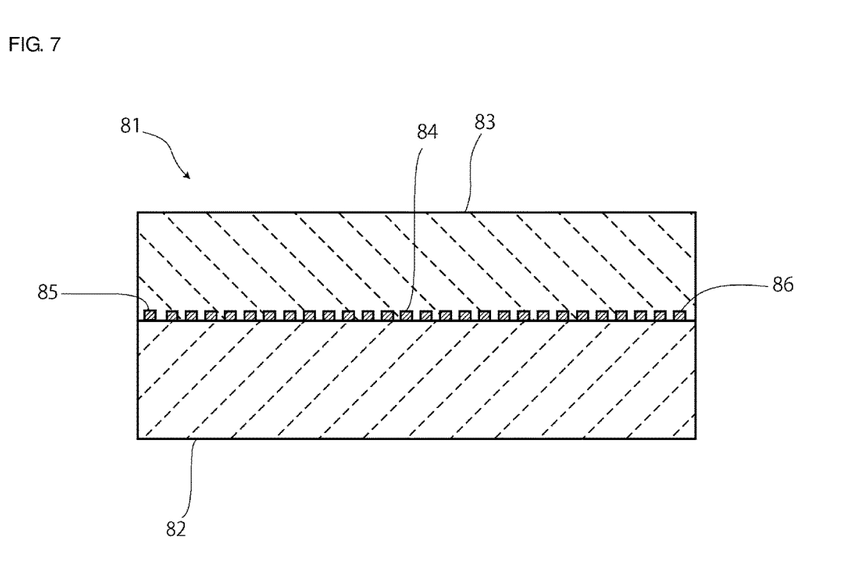
FIG. 7 is a front sectional view of an example structure of a boundary acoustic wave device.

Further, not limited to surface acoustic wave resonators, various preferred embodiments of the present invention may be applied to a boundary acoustic wave resonator having a structure as illustrated in FIG. 7. A boundary acoustic wave resonator 81 illustrated in FIG. 7 includes a piezoelectric substrate 82 and a solid medium 83 which is different from the piezoelectric substrate 82. IDT electrodes 84 and reflectors 85 and 86 are located at an interface between the piezoelectric substrate 82 and the medium 83. By making an electrode structure including the IDT electrodes 84 and the reflectors 85 and 86 be similar to the electrode structure 3 of the elastic wave resonator 1 according to a preferred embodiment of the present invention described above, a one-port boundary acoustic wave resonator is provided in accordance with the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave resonator comprising:
   a first terminal;
   a second terminal;
   a piezoelectric substrate having a polarization direction;
   first and second interdigital transducer electrodes arranged in an elastic wave propagation direction on the piezoelectric substrate;
   a shared reflector located between the first interdigital transducer electrode and the second interdigital transducer electrode;
   a first reflector located opposite to the shared reflector with the first interdigital transducer electrode therebetween; and
   a second reflector located opposite to the shared reflector it the second interdigital transducer electrode therebetween; wherein
   a projected polarization direction is perpendicular or substantially perpendicular to the elastic wave propagation direction, the projected polarization direction being a direction obtained by projecting the polarization direction onto a substrate surface of the piezoelectric substrate;
   assuming that a leading end side in the projected polarization direction is a first end portion side, and a base end side in the projected polarization direction is a second end portion side, the elastic wave resonator further comprises a wiring electrode electrically connecting respective first end portion side portions of the first reflector, the first interdigital transducer electrode, and the second reflector to one another, the wiring electrode defining the first terminal;
   respective second end portion side portions of the first interdigital transducer electrode and the shared reflector are electrically connected to each other and define the second terminal;
   respective first end portion side portions of the shared reflector and the second interdigital transducer electrode are electrically connected to each other;
   respective second end portion side portions of the second interdigital transducer electrode and the second reflector are electrically connected to each other; and
   the first and second interdigital transducer electrodes are connected in parallel between the first terminal and the second terminal.

2. The elastic wave resonator according to claim 1, wherein a voltage application direction in the first interdigital transducer electrode and a voltage application direction in the second interdigital transducer electrode are opposite to each other in the projected polarization direction.

3. The elastic wave resonator according to claim 1, wherein each of the first reflector, the shared reflector, and the second reflector includes a first end portion bus bar located on the first end portion side and a second end portion bus bar located on the second end portion side;

each of the first and second interdigital transducer electrodes includes a first bus bar located on the first end portion side and a second bus bar located on the second end portion side;

the second bus bar of the first interdigital transducer electrode and the second end portion bus bar of the shared reflector are concatenated and unified;

the first end portion bus bar of the shared reflector and the first bus bar of the second interdigital transducer electrode are concatenated and unified; and the second bus bar of the second interdigital transducer electrode and the second end portion bus bar of the second reflector are concatenated and unified.

4. The elastic wave resonator according to claim 3, wherein in each of portions where the bus bars and the corresponding end portion bus bars are respectively concatenated and unified, the end portion bus bar and the corresponding bus bar extend in a same direction and have a same width.

5. The elastic wave resonator according to claim 1, wherein the elastic wave resonator is a one-port elastic wave resonator.

6. An elastic wave filter device comprising a plurality of elastic wave resonators that define at least a portion of a ladder circuit, the ladder circuit includes a plurality of series arm resonators and a plurality of parallel arm resonators, the plurality of series arm resonators and the plurality of parallel arm resonators are defined by the plurality of elastic wave resonators, and at least one of the series arm resonators and the parallel arm resonators is defined by the elastic wave resonator according to claim 1.

7. An elastic wave filter device comprising a plurality of elastic wave resonators, wherein at least one of the plurality of elastic wave resonators is defined by the elastic wave resonator according to claim 1.

8. The elastic wave filter device according to claim 7, wherein the plurality of elastic wave resonators define at least a portion of a ladder circuit.

9. The elastic wave filter device according to claim 7, wherein a voltage application direction in the first interdigital transducer electrode and a voltage application direction in the second interdigital transducer electrode are opposite to each other in the projected polarization direction.

10. The elastic wave filter device according to claim 7, wherein each of the first reflector, the shared reflector, and the second reflector includes a first end portion bus bar located on the first end portion side and a second end portion bus bar located on the second end portion side;

each of the first and second interdigital transducer electrodes includes a first bus bar located on the first end portion side and a second bus bar located on the second end portion side;

the second bus bar of the first interdigital transducer electrode and the second end portion bus bar of the shared reflector are concatenated and unified;

the first end portion bus bar of the shared reflector and the first bus bar of the second interdigital transducer electrode are concatenated and unified; and the second bus bar of the second interdigital transducer electrode and the second end portion bus bar of the second reflector are concatenated and unified.

11. The elastic wave filter device according to claim 10, wherein in each of portions where the bus bars and the corresponding end portion bus bars are respectively concatenated and unified, the end portion bus bar and the corresponding bus bar extend in a same direction and have a same width.

12. The elastic wave filter device according to claim 7, wherein the at least one of the plurality of elastic wave resonators is a one-port elastic wave resonator.

13. A duplexer comprising:
a first band pass filter connected to an antenna end and a second band pass filter that is connected to the antenna end and that has a pass band different from that of the first band pass filter; wherein
at least one of the first and second band pass filters includes the elastic wave resonator according to claim 1.

14. The duplexer according to claim 13, wherein at least one of the first and second band pass filters includes a plurality of elastic wave resonators, and at least one of the plurality of elastic wave resonators closest to an antenna end is defined by the elastic wave resonator.

15. The duplexer according to claim 13, wherein a voltage application direction in the first interdigital transducer electrode and a voltage application direction in the second interdigital transducer electrode are opposite to each other in the projected polarization direction.

16. The duplexer according to claim 13, wherein each of the first reflector, the shared reflector, and the second reflector includes a first end portion bus bar located on the first end portion side and a second end portion bus bar located on the second end portion side;

each of the first and second interdigital transducer electrodes includes a first bus bar located on the first end portion side and a second bus bar located on the second end portion side;

the second bus bar of the first interdigital transducer electrode and the second end portion bus bar of the shared reflector are concatenated and unified;

the first end portion bus bar of the shared reflector and the first bus bar of the second interdigital transducer electrode are concatenated and unified; and the second bus bar of the second interdigital transducer electrode and the second end portion bus bar of the second reflector are concatenated and unified.

17. The duplexer according to claim 16, wherein in each of portions where the bus bars and the corresponding end portion bus bars are respectively concatenated and unified, the end portion bus bar and the corresponding bus bar extend in a same direction and have a same width.

18. The duplexer according to claim 13, wherein the elastic wave resonator is a one-port elastic wave resonator.

* * * * *